United States Patent [19]
Lee

[11] Patent Number: 5,999,576
[45] Date of Patent: Dec. 7, 1999

[54] DELAY-LOCKED LOOP FOR DATA RECOVERY

[75] Inventor: Chao-Cheng Lee, Hsinchu, Taiwan

[73] Assignee: Realtek Semiconductor Corp., Hsinchu, Taiwan

[21] Appl. No.: 08/891,839

[22] Filed: Jul. 14, 1997

[51] Int. Cl.$^6$ .................................................. H03D 3/22
[52] U.S. Cl. .................. 375/333; 375/376; 375/361; 341/70
[58] Field of Search .................... 375/375, 376, 375/361, 333; 341/70; 331/2; 360/40

[56] References Cited

U.S. PATENT DOCUMENTS

| | | | |
|---|---|---|---|
| 4,167,760 | 9/1979 | Decker | 360/40 |
| 4,853,943 | 8/1989 | Laws | 375/333 |
| 5,726,650 | 3/1998 | Yeoh et al. | 341/70 |
| 5,734,301 | 3/1998 | Lee et al. | 331/2 |
| 5,801,570 | 9/1998 | Mizuno et al. | 327/362 |

*Primary Examiner*—Stephen Chin
*Assistant Examiner*—Chieh M. Fan
*Attorney, Agent, or Firm*—Pillsbury Madison & Sutro, LLP

[57] ABSTRACT

A delay-locked loop which phase-locks the reference clock of crystal oscillation by certain identical delay units for generating certain precise time-sharing phase signals. These time-sharing phase signals can be utilized to recover the clock/data. The advantages of the invention, when comparing with the typical phase-locked loop, are: (1) it can be easily stabilized; (2) the phase error does not accumulate; (3) the loop filter requires only one capacitor, which reduces the area of chip; (4) no additional loop filter is need in multiport application, which further reduces the area of chip.

3 Claims, 7 Drawing Sheets

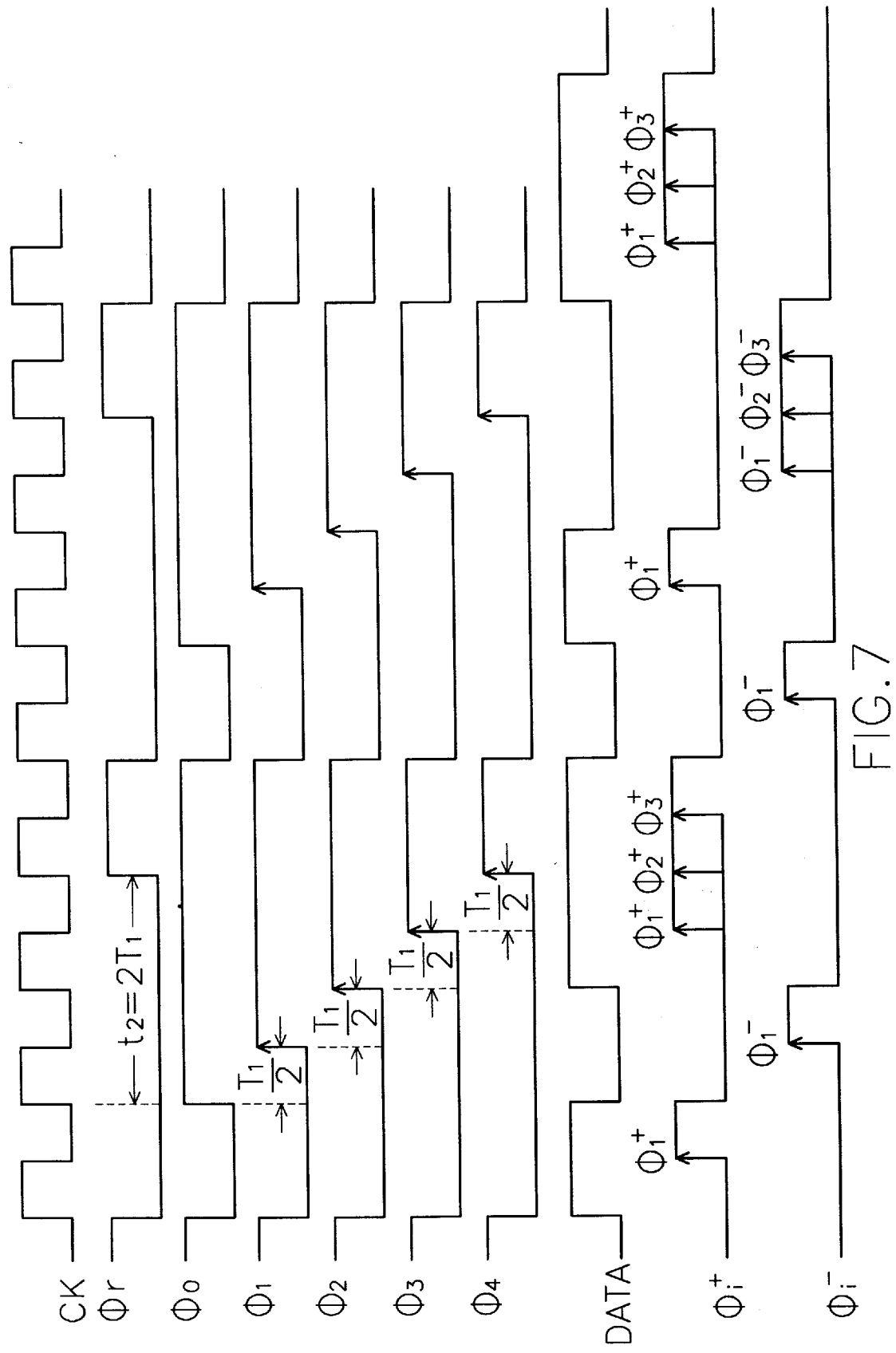

DELAY-LOCKED LOOP FOR DATA RECOVERY

BACKGROUND OF THE INVENTION

1. Field of the Invention

The invention relates to a delay-locked loop for data recovery, and more particularly, for recovering the Manchester coded digital data having two kinds of fixed length of "1" and "0" to its original data.

2. Description of the Related Art

FIG. 1 schematically illustrates coding of a Manchester code, while FIG. 2 gives a sample of the coded result. For Manchester code, there are only two kinds of fixed lengths for continuous "1" and "0". For example, the two lengths of Ether Net application having a transferring speed of 10 Mbps are 50 and 100 ns.

The disadvantages when using the typical phase-locked loop to recover the clock/data are that: (1) since the signal contains different length of "0" and "1" which do not have a fixed period, the phase-locked loop can not be stabilized easily; (2) the phase-locked loop adjusts the frequency of recovering clock to synchronize the signals, which also causes the accumulation of phase errors from one period to the next period; and (3) the loop filter of a phase-locked loop is a RC circuit which results in the resistor and capacitor often occupying most of the area during the manufacture of a semiconductor device. In addition, because each port requires a respective set of phase-locked loop during a multiport application, the increase of area is directly proportional to the increase of number of ports.

SUMMARY OF THE INVENTION

Therefore, the object of the invention is to provide a delay-locked loop which recovers the Manchester coded digital data having certain fixed length of "1" and "0" to its original data. Some advantages are that (1) the loop can be easily stabilized; (2) the phase errors do not accumulate; (3) the area of chip is small; and (4) the increase of area of chip is not directly proportional to the increase of number of ports during multiport application.

The delay-locked loop of the invention, which transforms the coded digital data having two kinds of fixed length: T1, 2T1 of "1" and "0" into its original data, includes an encoder, a first, second and third phased delay device, a phrase/frequency detector, a charge pumr and loop filter.

The encoder receives a clock signal CK and generates two signals $\phi_0$ and $\phi_r$ which have the same periods. Both of the signals simultaneously change from "1" into "0" within one period. After a time t1, the signal $\phi_0$ changes from "0" into "1" and after another time t2=, the signal $\phi_r$ changes from "0" into "1". While after yet another time t3 both signals simultaneously change from "1" into "0";

The first phase-delayed device receives the signal $\phi_0$ from the encoder and the control signal Vc, and outputs a signal $\phi_4$ whose period is identical to the signal $\phi_0$. When the signal $\phi_0$ changes from "1" into "0", the signal $\phi_4$ also changes from "1" to "0" simultaneously. When the signal $\phi_0$ changes from "0" into "1" and keeps in "1" for a time t2, the signal $\phi_4$ changes from "0" into "1";

The second phase-delayed device receives the data DATA from the outside and the control signal Vc, and outputs signals $\phi_1^+$, $\phi_2^+$, $\phi_3^+$, $\phi_4^+$. The relationship between these $\phi_i^+$S ($1 \leq i \leq 4k$) and the DATA is as follows: (1) when DATA changes from "1" nto "0", the $\phi_i^+$ ($1 \leq i \leq 4$) changes from "1"to "0" simultaneously; (2) when DATA changes from "0" to "1" and keeps in "1" for a time i x (T1 /2), the $\phi_i^+$ ($1 \leq i \leq 4$) changes from "0" to "1";

The third phase-delayed device receives the complement of data DATA from the outside and the control signal Vc, and outputting signals $\phi_1^-$, $\phi_2^-$, $\phi_3^-$, $\phi_4^-$. The relationship between these $\phi_i^-$ ($1 \leq i \leq 4$) and the DATA is as follows: (1) when DATA changes from "1" to "0", the $\phi_i^-$S ($1 \leq i \leq 4$) change from "1" into "0" simultaneously; (2) when the complement of DATA changes from "0" into "1" and keeps in "1" for a time ix (T1/2), the $\phi_i^-$ ($1 \leq i \leq 4$ change from "0" into "1";

The phase/frequency detector receives the signal $\phi_r$ from the encoder and the signal $\phi_4$ from the first phase-delayed device, and outputs the signals up and dn as follows: (1) when the phase of signal $\phi_r$ is ahead of the phase of signal $\phi_4$ up is "1" and dn is "0"; (2) when the phase of signal $\phi_r$ is behind the phase of signal $\phi_4$ up is "0" and dn is "1".

The charge pump and loop filter receive the signals up and dn from the phase/frequency detector and output control signal Vc to the first, second, and third phase-delayed devices. Therefore, when up is "1" and dn is "0", the level of the control signal Vc and current $I_1, (I_1=I_2=I_3=I_4)$ is increased to advance the phases of $\phi_4$, $\phi_i^+$, and $\phi_i^-$ ($1 \leq i \leq 4$). When up is "0" and dn is "1", the value of the control signal Vc and the value of current $I_1(I_1=I_2=I_3=I_4)$ is decreased to delay the phases of $\phi_4$, $\phi_i^+$, and $\phi_i^-$ ($1 \leq i \leq 4$). Therefore, the phases of these signals $\phi_i^+$ and $\phi_i^-$ ($1 \leq i \leq 4$) can be accurately locked in the needed position after the whole loop is stabilized.

The Manchester coded digital data can be recovered by using said $\phi_i^+$ and $\phi_i^-$ ($1 \leq i \leq 4$) as follows: (1) if $\phi_{2i-1}^+$ appears and $\phi_{2i+1}^+$ ($i=1,2$) does not, the digital data being judged to be "1" with a length i x T1; (2) if $\phi_{2i-1}^-$ appears and $\phi_{2i+1}^-$ (i=1,2) does not, the digital data is judged to be "0" with a length of I x T1. Therefore, the data DATA is recovered.

The detailed features and characteristics of the invention is to be described more clearly with the descriptions of the preferred embodiments in conjunction with the accompanying drawings.

BRIEF DESCRIPTION OF THE DRAWINGS

FIG. 7 shows the clock of different signals shown in FIG. 3.

DESCRIPTION OF THE PREFERRED EMBODIMENT

Figure 1:
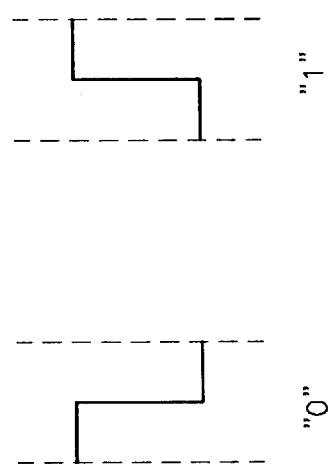
FIG. 1 illustrates the encoding procedure of Manchester code.
Figure 2:
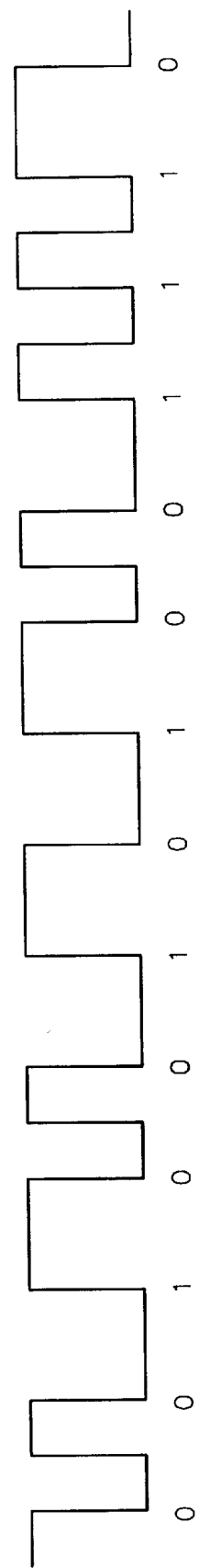
FIG. 2 illustrates that the "1" and "0" of Manchester-coded digital have only two fixed continuous lengths.
Figure 3:
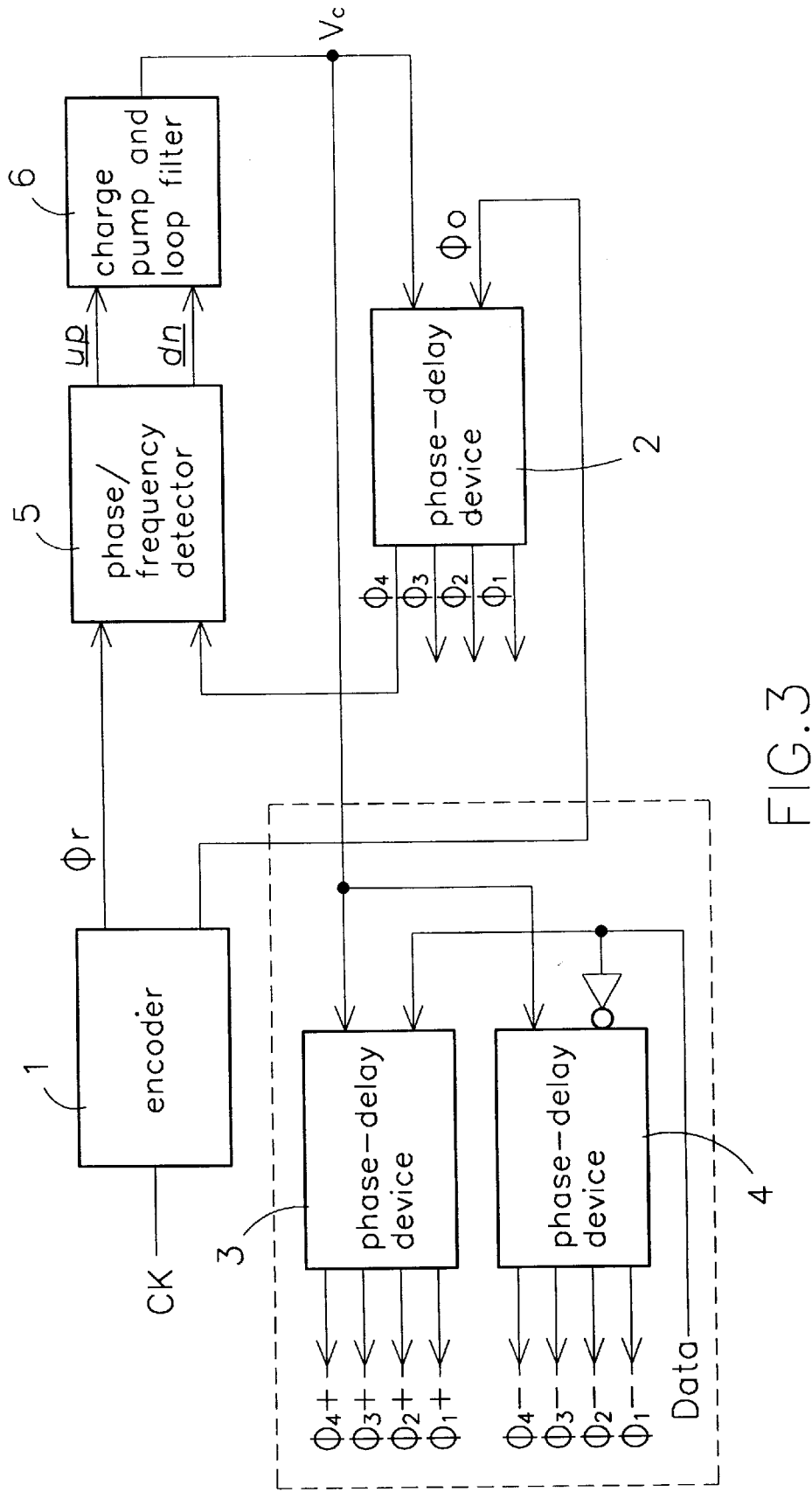
FIG. 3 is a block diagram of the delay-locked loop according to the invention.

When the data to be recovered is a Manchester code, the delay-locked loop according to the invention (FIG. 3)

includes: an encoder 1, a phase-delayed device 2, a phase-delayed device 3, a phase-delayed device 4, a phase/frequency detector 5, and a charge pump and loop filter 6. The functions of each component are described in the summary of the invention. The phase of output signal $\phi_4$ of the phase-delayed device 2 falls behind the phase of the signal $\phi_0$ by $t_2$=2Ti. The output signals of phase-delayed device 3 are $\phi_1^+$, $\phi_2^+$, $\phi_3^+$, and $\phi_4^+$; and the output signals of phase-delayed device 4 are $\phi_1^-$, $\phi_2^-$, $\phi_3^-$, and $\phi_4^-$.

Figure 4:
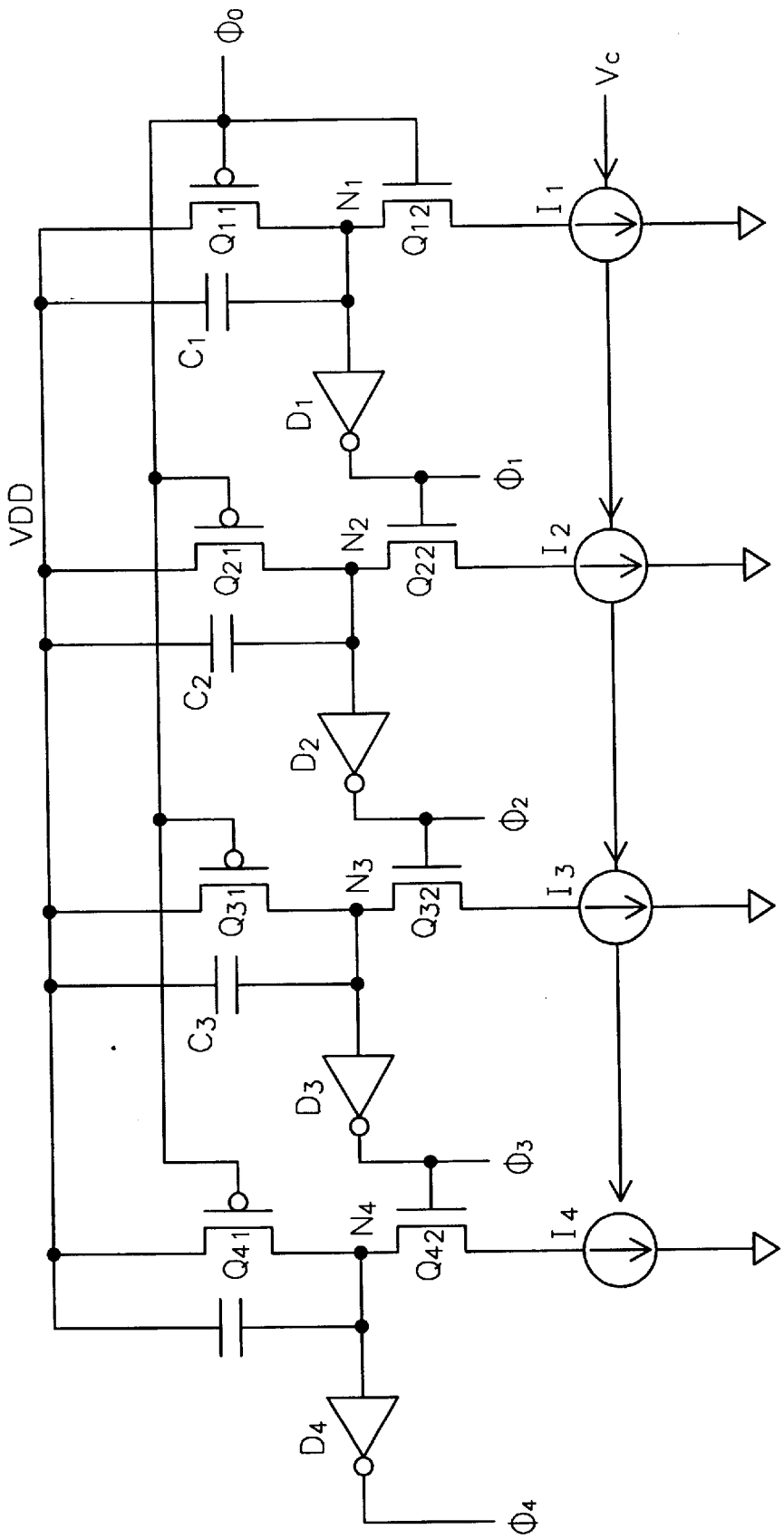
FIG. 4 shows the circuit diagram of a preferred embodiment of phase-delayed device 2 shown in FIG. 3, this is also a preferred embodiment of phase-delayed device 3 or 4.

The phase-delayed device 2, phase-delayed device 3, and phase-delayed device 4 may be formed with the same circuit. FIG. 4 shows the circuit diagram of the preferred embodiment of phase-delayed device 2. The circuit includes four delay units whose structures are identical with two input terminals and one output terminal. The operation of the first delay unit is described below: (1) when signal $\phi_0$ is transformed from "1" into "0", the PMOS transistors Q11, Q21, Q31, and Q41 momentarily change from an OFF state to an ON state, and the nodes N1, N2, N3, and N4 are pulled to high potential, while the complement signals $\phi_1$, $\phi_2$, $\phi_3$, and $\phi_4$ are momentarily changed into "0"; (2) when signal $\phi_0$ changes from "0" into "1", the NMOS transistor Q12 momentarily changes from an OFF state to an ON state. Since the PMOS transistors Q11 is OFF now, the drain current of transistor Q12 is supplied by discharging of capacitor C1. Therefore, the potential of node N1 decreases gradually until the potential is lower than the threshold of inverter D1 and thus changing the signal $\phi_1$ from "0" to "1". Now the NMOS transistor Q22 of the second delay unit momentarily changes form an OFF state to an ON state. Similarly, the third and fourth delay units also have the same operating steps. Since the current 11, 12, 13, and 14 are controlled by the voltage signal Vc, each of the currents has the same value, which makes the time delays caused by these delay units identical. The output $\phi_4$ of the fourth delay unit is the output signal of the phase-delayed device 2.

The phase-delayed device 3 and phase-delayed device 4 can also have the same circuit as the phase-delayed device 2. We replace the signal $\phi_0$ with the data DATA or the complement of DATA, and export the outputs of every delay units as the output signals.

Figure 5A:
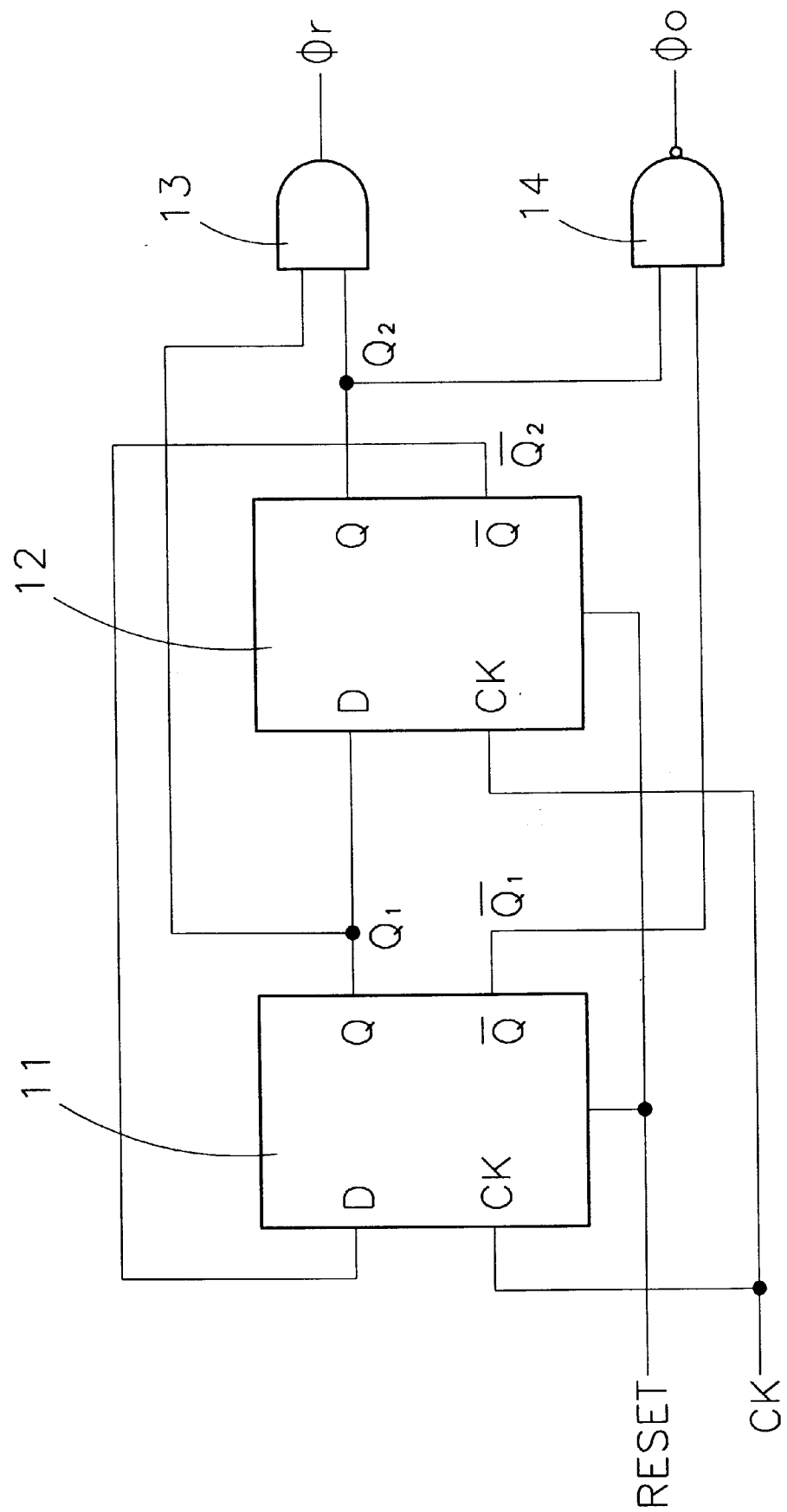
FIG. 5A shows the circuit diagram of a preferred embodiment of decoder 1 shown in FIG. 3.
Figure 5B:
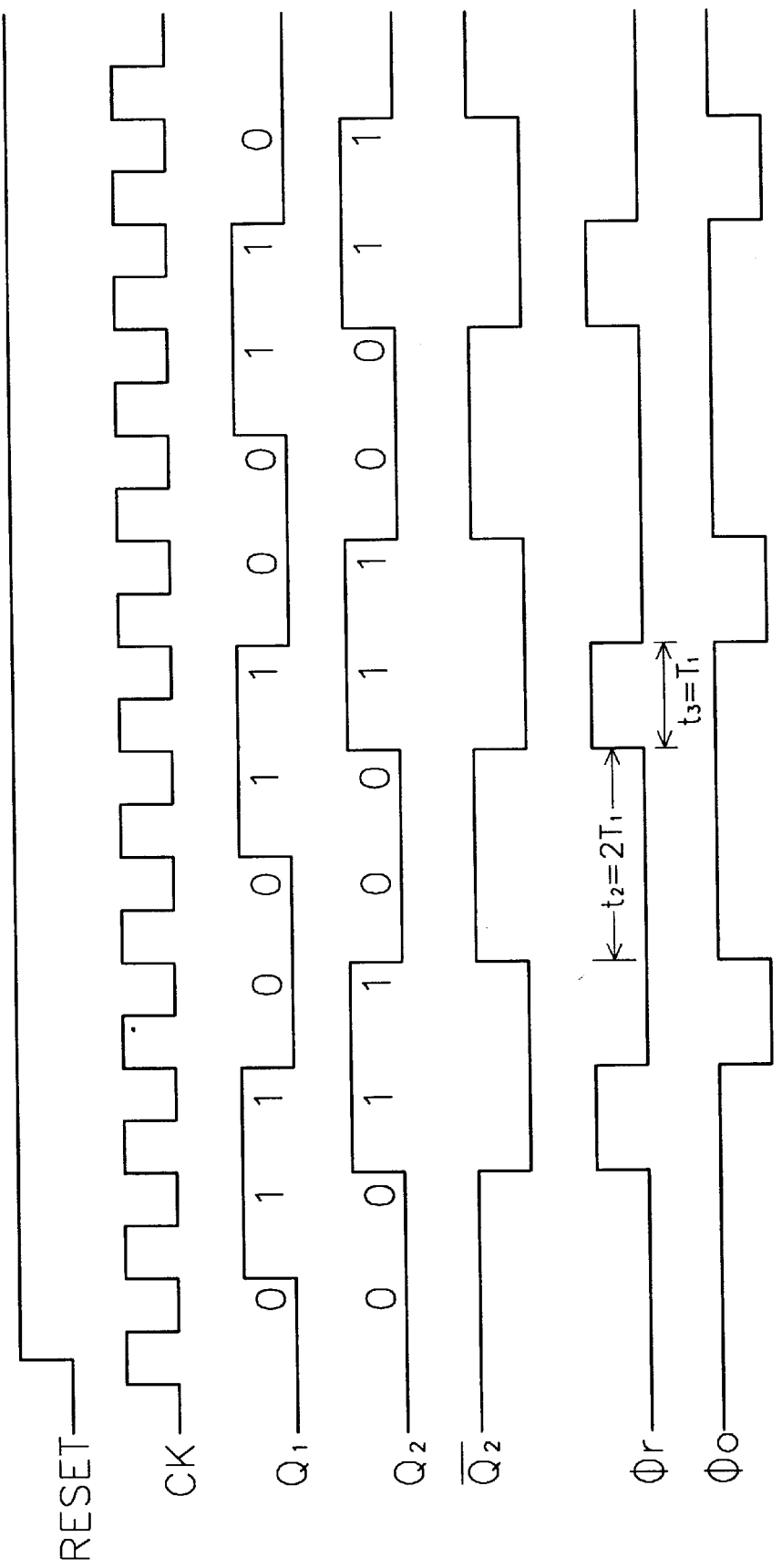
FIG. 5B shows the wave forms of different signals according to the decoder circuit shown in FIG. 5A.

FIG. 5A shows the circuit diagram of the preferred embodiment of encoder 1, the circuit includes: D flip-flop 11, D flip-flop 12, AND gate 13, and NAND gate 14. The period of clock signal CK is T1, and the signal RESET is used for resetting all settings. The output of the AND gate 13 is used as signal $\phi_r$, and the output of the NAND gate 14 is used as signal $\phi_0$. FIG. 5B shows the wave forms of every signal according to the circuit shown in FIG. 5A wherein the relationships between signal $\phi_r$ and signal $\phi_0$ are described below. When the signal $\phi_0$ changes from "0" to "1", after a time $t_2$=2T1, the signal $\phi_r$ also changes from "0" to "1". There is no limitations between time t1 and t3 wherein t1 is the time interval from when the signal $\phi_0$ changes from "1" to "0" until the the signal $\phi_0$ changes from "0" to "1". T3 is the time interval from when the signal $\phi_r$ changes from "0" to "1" until the signal $\phi_0$ changes from "1" to "0". According to the embodiment shown in FIG. 5B, t1=t3=T1.

Figure 6:
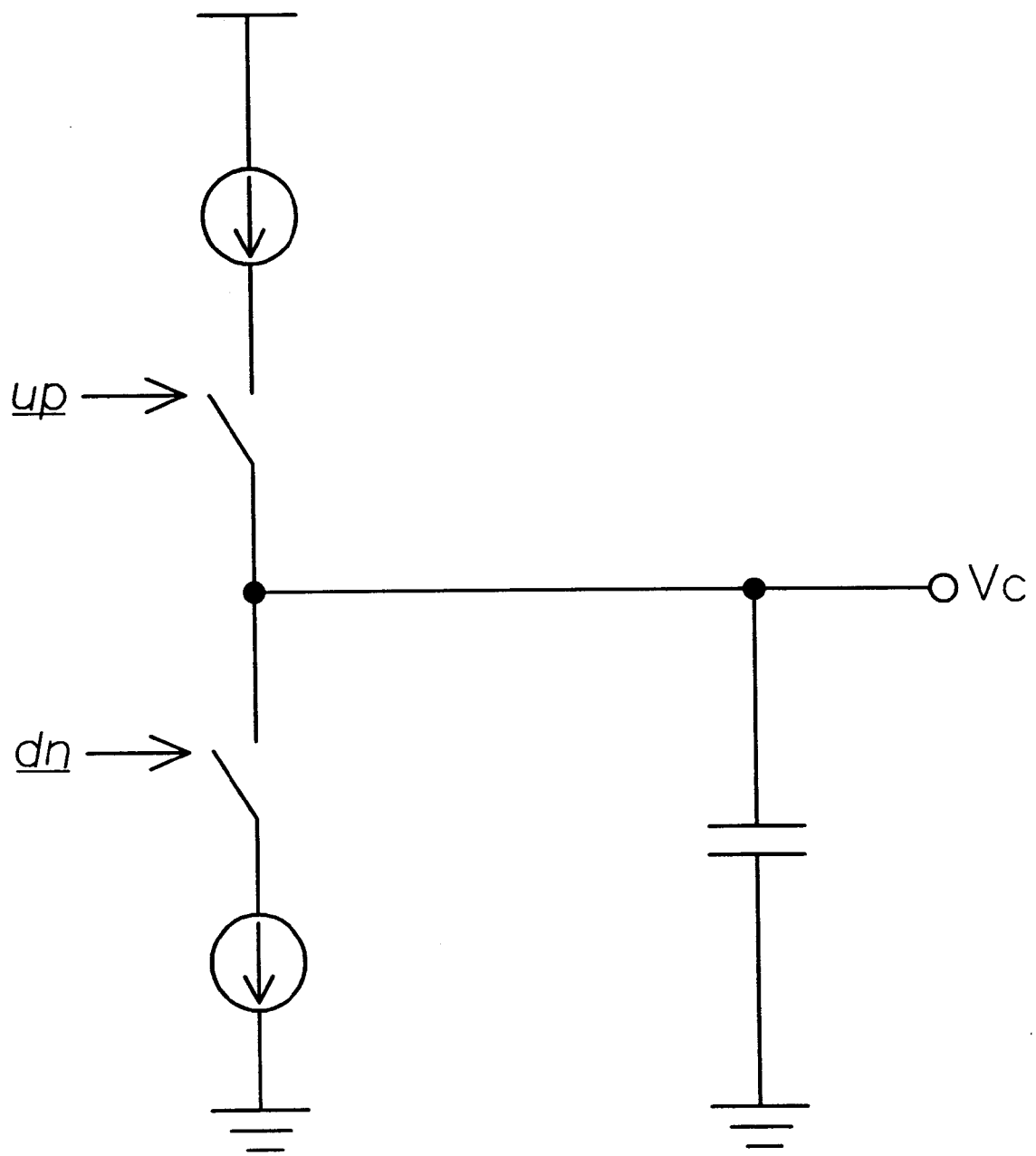
FIG. 6 shows the circuit diagram of a preferred embodiment of charge pump and loop filter 6 shown in FIG. 3.

FIG. 6 shows the circuit diagram of the preferred embodiment of charge pump and loop filter 6. When up is "1" and dn is "0", Vc increases and when up is "0" and dn is "1", Vc decreases. While both up and dn are "0", Vc remains unchanged.

FIG. 7 shows the timing diagram of the signals shown in FIG. 3. The delay-locked loop according to the invention is still immune from a very large phase jitter, e.g., +(0.5 T1−$\epsilon$) wherein the $\epsilon$ is a small value, while such a serious phase jitter is quite rare.

Taken altogether, there are four advantages of the invention:

1. It can be easily stabilized. The wave forms, $\phi_r$ and $\phi_4$, are identical. Therefore, it can be stably phase-locked by a typical phase/frequency detector.

2. The phase error does not accumulate. Since the phase delay begins at the rising edge of a signal and ends at the falling edge of a signal, the phase error does not cumulate to the next period.

3. The loop filter requires only one capacitor, which reduces the area of chip. Since the phase error does not accumulate, the RC circuit is not necessary and the area of chip is retrenched.

4. The increase of area of chip is not directly proportional to the increase of number of ports during multiport application. It is not necessary to repeat the whole circuit in each port during multiport application, only the circuit within the dotted frame in FIG. 3 has to be repeated, which greatly reduces the area of chip.

The aforesaid preferred embodiments of the invention are used only for illustration purpose rather than for limiting this invention. Variations and modifications may be made without departing from the spirit and scope of the invention. Therefore, the scope of this invention is intended to cover the following appended claims.

I claim:

1. A delay-locked loop for recovering data, which recovers Manchester coded digital data having two kinds of fixed length of "1" and "0": T1 and 2T1, into its original data, wherein T1=0.5× (the inverse of nonreturn-to-zero data rate), comprising:

an encoder for receiving a clock signal and generating two signals, $\phi_0$ and $\phi_r$, having the same periods, both of said signals simultaneously changing from "1" into "0" within one period, after a time t1, said signal $\phi_0$ changes from "0" to "1", after another time t2=2T1, said signal $\phi_r$ changes from "0" to "1", and while after another time t3, both of the signals simultaneously change from "1" to "0";

a first phase-delayed device for receiving said signal $\phi_0$ from said encoder and a control signal, and outputting a signal $\phi_4$ whose period is identical to said signal $\phi_0$ such that;

(1) when said signal $\phi_0$ changes from "1" to "0", said signal $\phi_4$ also changes from "1" to "0" simultaneously;

(2) when the signal $\phi_4$ changes from "0" into "1" and keeps in "1" for a time t2, the signal $\phi_4$ changes from "0" to "1";

a second phase-delayed device for receiving the data DATA from outside and said control signal, and outputting signals $\phi_1^+$, $\phi_2^+$, $\phi_3^+$, $\phi_4^+$, the relationship between said $\phi_i^+$s (1≦i≦4) and the data DATA satisfying that:

(1) when the DATA changes from "1" to "0", the $\phi_i^+$s (1≦i≦4) changes from "1" to "0" simultaneously;

(2) when said DATA changes from "0" to "1" and keeps in "1" for a time i×(T1 /2), said $\phi_i^+$s (1≦i≦24) changes from "0" to "1";

a third phase-delayed device for receiving the complement of the data DATA from the outside and said control signal, and outputting signals $\phi_1^+$, $\phi_2^+$, $\phi_3^+$, $\phi_4^+$; the relationship between said $\phi_i^-$s (1≦i≦4) and the DATA satisfying that:

(1) when the complement of the DATA changes from "1" to "0", said $\phi_i^-$s ($1 \leq i \leq 4$) changes from "1" to "0" simultaneously;
(2) when the complement of said DATA changes from "0" to "1" and keeps in "1" for a time $i \times (T1/2)$, these $\phi_i^-$ ($1 \leq i \leq 4$) from "0" to "1";

a phase/frequency detector for receiving signal $\phi^r$ from said encoder and signal $\phi_4$ from said first phase-delayed device, and outputting signals up and dn as follows:
(1) when the phase of signal $\phi_r$ is ahead of the phase of signal $\phi_4$, up being "1" and dn being "0";
(2) when the phase of signal $\phi_r$ is behind the phase of signal $\phi_4$, up being "0" and dn being "1".

a charge pump and loop filter for receiving the signals up and dn from said phase/frequency detector and outputting a control signal to said first, second, and third phase-delayed devices such that:
(1) when up is "1" and dn is "0", increasing the value of the control signal to advance the phases of $\phi_4$, $\phi_i^+$, and $\phi_i^-$ ($1 \leq i \leq 4$);
(2) when up is "0" and dn is "1", decreasing the value of the control signal to delay the phases of $\phi_4$, $\phi_i^+$, and $\phi_i^-$ ($1 \leq i \leq 4$) so that the phases of the signals $\phi_i^+$ and $\phi_i^-$ ($1 \leq i \leq 4$) can be accurately locked in the needed position after the whole loop is stabilized;

the coded digital data can be recovered by using said $\phi_i^+$ and $\phi_i^-$ ($1 \leq i \leq 4$) as follows:
(1) if $\phi_{2i-1}^+$ appears and $\phi_{2i+1}^+$ (i=1,2) does not, the digital data being judged to be "1" with a length $i \times T1$;
(2) if $\phi_{2i-1}^-$ appears and $\phi_{2i+1}^-$ (i=1,2) does not, the digital data being judged to be "0" with a length $i \times T1$; therefore, the data DATA being recovered.

2. A delay-locked loop for recovering data as described in claim 1 wherein the circuit structure of said first phase-delayed device is composed of four identical delay units, each delay unit having two input terminals and one output terminal wherein the first delay unit comprises:
a first PMOS transistor, a first NMOS transistor, a first absorbing current source, a first capacitor, and a first inverter, wherein gate terminals of said first PMOS and NMOS transistors receiving said signal $\phi_0$, drain and source terminals of said first PMOS transistor connecting between a power source and said first NMOS transistor, the drain and source terminals of said first NMOS transistor connecting between said first PMOS transistor and said first current source, said first current source being a voltage-controlled current source and being controlled by the control signal, the first terminal of said first capacitor connecting to the power source VDD and the second terminal connecting to the joint of said first PMOS and NMOS transistors and to the input terminal of said first inverter, the output of said first inverter being an output signal $\phi_1$, of said first delay unit;

the second delay unit comprising:
a second PMOS transistor, a second NMOS transistor, a second absorbing current source, a second capacitor, and a second inverter; a gate terminal of said second PMOS transistor receiving said signal $\phi_0$, the gate terminal of said second NMOS transistor receiving the output signal $\phi_1$, while the connections of the other parts being substantially identical to the connections of the parts of said first delay unit, the output of said second inverter being an output signal $\phi_2$ of said second delay unit;

the third delay unit comprising:
a third PMOS transistor, a third NMOS transistor, a third absorbing current source, a third capacitor, and a third inverter; a gate terminal of said third PMOS transistor receiving the signal $\phi_0$, the gate terminal of said third NMOS transistor receiving the signal $\phi_2$, while the connections of the other parts being substantially identical to the connections of the parts of said first delay unit, the output of said third inverter being the output signal $\phi_3$ of said third delay unit;

the fourth delay unit comprising:
a fourth PMOS transistor, a fourth NMOS transistor, a fourth sink current source, a fourth capacitor, and a fourth inverter, a gate terminal of said fourth PMOS transistor receiving the signal $\phi_0$, a gate terminal of said fourth NMOS transistor receiving the signal $\phi_3$, while the connections of the other parts being substantially identical to the connections of the parts of said first delay unit, the output of said forth inverter being the output signal $\phi_4$ of said fourth delay unit, and the signal $\phi_4$ being the output of said first phase-delayed device;

the circuit structure of said second phase-delayed device being substantially identical to the circuit structure of said first phase-delayed device which is composed of four delay units, in which the gate terminals of PMOS transistors of every delay units receiving the data DATA and the output signals of every delay units being the four outputs of said second phase-delayed device;

the circuit structure of said third phase-delayed device being substantially identical to the circuit structure of said first phase-delayed device which is composed of four delay unit, in which the gate terminals of PMOS transistors of every delay units receiving the complement of the data DATA and the output signals of every delay units being the four outputs of said third phase-delayed device.

3. A delay-locked loop for recovering data as described in claim 2 wherein the circuit of said encoder comprises:
a first D flip-flop,
a second D flip-flop,
an AND gate, and
a NAND gate, wherein both said AND gate and said NAND gate have two input terminals,
the Q terminal of said first D flip-flop connecting to the D terminal of said second D flip-flop and the first input terminal of said AND gate, the Q terminal of said first D flip-flop connecting to the first terminal of said NAND gate,
the Q terminal of said second D flip-flop connecting to the second input terminal of said AND gate and the second input terminal of said NAND gate, the Q terminal of said second D flip-flop connecting to the D terminal of said first D flip-flop,
the output signal of said AND gate being the signal $\phi_r$, the output signal of said NAND gate being the signal $\phi_0$.

* * * * *